United States Patent
Duyck et al.

(10) Patent No.: US 10,237,114 B2
(45) Date of Patent: Mar. 19, 2019

(54) TRANSMITTER

(71) Applicant: NEWTEC CY, Sint-Niklaas (BE)

(72) Inventors: Dieter Duyck, Sint-Niklaas (BE); Olivier De Deken, Antwerp (BE)

(73) Assignee: NEWTEC CY, Sint-Niklaas (BE)

(*) Notice: Subject to any disclaimer, the term of this patent is extended or adjusted under 35 U.S.C. 154(b) by 0 days.

(21) Appl. No.: 16/065,861

(22) PCT Filed: Dec. 20, 2016

(86) PCT No.: PCT/EP2016/082008
§ 371 (c)(1),
(2) Date: Jun. 25, 2018

(87) PCT Pub. No.: WO2017/108845
PCT Pub. Date: Jun. 29, 2017

(65) Prior Publication Data
US 2019/0013991 A1    Jan. 10, 2019

(30) Foreign Application Priority Data

Dec. 24, 2015   (BE) .................................. 2015/5845

(51) Int. Cl.
*H04L 27/36* (2006.01)
*H03F 1/32* (2006.01)
(Continued)

(52) U.S. Cl.
CPC ......... *H04L 27/367* (2013.01); *H03F 1/3241* (2013.01); *H03F 3/189* (2013.01);
(Continued)

(58) Field of Classification Search
CPC .............. H04L 27/367; H04L 27/3411; H04L 27/2624; H03F 1/3241; H03F 3/189; H03F 3/245; H03F 2200/336
See application file for complete search history.

(56) References Cited

U.S. PATENT DOCUMENTS 6,963,624 B1   11/2005   He
7,123,663 B2   10/2006   De Gaudenzi et al.
(Continued)

FOREIGN PATENT DOCUMENTS

EP   1371202 A2   12/2003
EP   1374517 B1    3/2005
(Continued)

OTHER PUBLICATIONS

Alvarez-Diaz et al., "Joint Precoding and Predistortion Techniques for Satellite Telecommunication Systems," IEEE, 2005, pp. 688-692.
(Continued)

*Primary Examiner* — Jaison Joseph
(74) *Attorney, Agent, or Firm* — Workman Nydegger

(57) ABSTRACT

A transmitter device comprises a first predistortion circuit and a second predistortion circuit having at least one correction stage provided with a correction path for determining a correction term. The correction term for each source signal is a function of a corresponding symbol of a predefined constellation for each source signal and of the output of a model having a circuit to emulate modulation means and the second predistortion circuit, a circuit to emulate a non-linear transmission link over which a predistorted version of an aggregate pulse-shaped signal is to be transmitted for amplitude levels before saturation of an AM/AM characteristic of the transmission link occurs and to emulate the non-linear transmission link for amplitude levels beyond saturation of the AM/AM characteristic, and a circuit to emulate demodulation means.

7 Claims, 14 Drawing Sheets

(51) Int. Cl.
*H03F 3/189* (2006.01)
*H04L 27/34* (2006.01)
*H03F 3/24* (2006.01)
*H04L 27/26* (2006.01)

(52) U.S. Cl.
CPC .......... *H03F 3/245* (2013.01); *H04L 27/3411* (2013.01); *H03F 2200/336* (2013.01); *H04L 27/2624* (2013.01)

(56) References Cited

U.S. PATENT DOCUMENTS

| 8,355,462 | B2 | 1/2013 | Beidas et al. | |
|---|---|---|---|---|
| 2015/0124907 | A1* | 5/2015 | Li | H03F 1/0294 375/320 |
| 2015/0311927 | A1 | 10/2015 | Beidas et al. | |
| 2016/0006597 | A1* | 1/2016 | Simoens | H04L 27/367 375/296 |
| 2016/0241359 | A1* | 8/2016 | Stopler | H04B 1/0458 |

FOREIGN PATENT DOCUMENTS

| EP | 1129556 | B1 | 8/2007 |
|---|---|---|---|
| EP | 2922217 | A1 | 9/2015 |
| WO | 2014122080 | A1 | 8/2014 |

OTHER PUBLICATIONS

Beidas et al., Multicanier Successive Predistortion for Nonlinear Satellite Systems, IEEE Transactions on Communications, vol. 63, No. 4, Apr. 2015, pp. 1373-1382.

Benedetto et al., "Modelilng and Performance Evaluation of Non-linear Satellite Links—A Volterra Series Approach," IEEE Transactions on Aerospace and Electronic Systems, vol. AES-15, No. 4, Jul. 1979, pp. 494-507.

Biglieri et al., "Adaptive Cancellation of Nonlinear Intersymbol Interference for Voiceband Data Transmission," IEEE Journal on Selected Areas in Communications, vol. Sac-2, No. 5, Sep. 1984, pp. 765-777.

"Digital Video Broadcasting (DVB); Second Generation Framing Structure, Channel Coding and Modulation Systems for Broadcasting, Interactive Services, News Gathering and Other Broadband Satellite Applications (DVB-S20)," ETSI EN 302 307 v1.2.1, 2009, 78 pages.

Kayhan et al., "Constellation Design for Transmission over Nonlinear Satellite Channels," Globecom 2012—Symposium on Selected Areas in Communication, 2012, pp. 3401-3406.

Belgian Search Report from BE Application No. 201505845, dated Aug. 9, 2016.

International Search Report and Written Opinion from PCT Application No. PCT/EP2016/082008, dated Apr. 10, 2017.

* cited by examiner

TRANSMITTER

FIELD OF THE INVENTION

The present invention is generally related to the field of techniques for reducing signal distortion in a digital communication system. More in particular, it relates to techniques for predistorting a modulated signal.

BACKGROUND OF THE INVENTION

The present invention relates to the predistortion of a modulated signal from one or more sources (also denoted single-carrier and multicarrier transmission, respectively) prior to its transmission over a wired or wireless channel, with the purpose of reducing the distortion incurred by the signal from the transmission over the channel. An example of such a channel is a relayed communication channel (such as a satellite communication channel), whereby optimal relay resources usage requires using the amplifier at the relay (e.g., the satellite amplifier) at or close to its saturation point. Under these circumstances, the transmitted signal typically incurs distortion, reducing the communication reliability. Another example is relayed or non-relayed transmission (wired or wireless) where the high power amplifier (HPA) in the transmitter is used close to its saturation point in order to save costs on this power amplifier.

The transmitter output in a digital communication system can be seen as a baseband waveform. In the case of one source, the waveform is a pulse train modulated by a sequence of complex symbols. This modulation is typically performed by applying the symbols to a pulse shaping filter (PSF). In an operation referred to as mapping each symbol is selected from an allowed set of complex values, represented by an in-phase and quadrature component (I and Q, respectively). The selected symbol depends on the bits corresponding to the source. The set of possible symbols is called a constellation, further referred to as "system constellation", as it is the constellation used for mapping in the transmitter and demapping in the receiver. Several mapping strategies can be envisaged, including quadrature amplitude modulation (QAM), phase shift keying (PSK) and amplitude and phase shift keying (APSK). These mapping strategies employ different types of system constellations. For example, in the APSK mapping scheme the constellation points are located on two or more concentric rings. Mapping schemes are generally disclosed in a transmission standard, such as ETSI EN 302 307 v1.2.1: Second generation framing structure, channel coding and modulation systems for Broadcasting, Interactive Services, News Gathering and other broadband satellite applications. In the remainder of this text this reference is referred to as the DVB-S2 standard. The combination of a system constellation and a forward error correcting code (FEC) is referred to as a modulation and coding or a modcod. As different prior art documents often use other notations to denote the same physical entity, the notation is explicitly recalled in this document. The complex (I,Q) values provided to the PSF are referred to as transmit symbols. These symbols may or may not be predistorted by a symbol predistorter. The PSF output is a complex signal and can be applied to a signal predistorter or not. The output of the PSF (and possibly the signal predistorter) is denoted as the pulse-shaped signal. In the case of one source, this pulse-shaped signal equals the transmit signal. In the case of more than one source, a pulse-shaped signal is created for each source. The transmit signal then is a non-linear combination of all pulse-shaped signals. The non-linear combination is often referred to as mixing. The non-linear combination corresponds to translating each pulse-shaped signal to its corresponding carrier frequency after which all translated signals are added.

In FIG. 1 an example of a sample-level transmission link, more specifically a satellite communication link, with its main components is shown. The sample-level transmission link includes the satellite transponder, but also the front-end in the modulator and demodulator (e.g., digital-to-analog converter (DAC) in the modulator, analog-to-digital converter (ADC) in demodulator, I/Q (de-)modulation and amplification). In FIG. 1, the DAC and ADC are included in the I/Q modulator and demodulator, respectively. The transmit signal can be formed by one or more sources. This illustration can be generalized to any relayed communication system by generalizing the satellite to a relay. FIG. 2 illustrates a sample-level transmission link for a non-relayed communication system. The connection between the HPA and low-noise amplifier (LNA) can contain channel impairments such as fading, but it does not have a power amplifier in between. The digital transmitter output in a digital communication system is the transmit signal. In the example structure of FIG. 1 or FIG. 2 the transmit signal is I/Q modulated onto a carrier waveform. Before transmission over the air, the carrier waveform is amplified by the transmitter high power amplifier (HPA), e.g. a ground station HPA for satellite communications. In a relayed communication system, for example satellite communications, the signal is received by the relay. In general, this relay filters and amplifies the signal it receives. In the case of satellite communications, the relay is denoted the satellite's transponder, which operation is illustrated in the simplified schematic drawing of FIG. 3. The transponder's incoming signal is passed to a bandpass input multiplexer filter (IMUX), amplified by a travelling wave tube amplifier (TWTA) and filtered again by a bandpass output multiplexer filter (OMUX). A transponder or a relay may contain other components as well, such as up- and down-converters. The amplifier may be of another type than a TWTA. The relay's output signal travels to a plurality of receivers. One such receiver amplifies the signal through a low-noise amplifier (LNA), I/Q demodulates the amplified signal to yield the complex receive signal. For decoding one of the sources, the receive signal is typically provided to a receive filter (typically a PSF) that, after decimation, outputs the received symbols corresponding to that source. When referring to a sample-level transmission link in the following, the structures shown in FIG. 1 and FIG. 2 are referred to. Both structures have one element in common, i.e., at least one high power amplifier (an HPA and/or a TWTA) is present in the transmission link, which can deform the transmit signal in a non-linear way.

In the absence of channel distortion and noise, the receive signal is equal to the transmit signal. On a sample-level transmission link of practical use, however, the non-linear channel changes the phase and amplitude of the transmit signal as it passes through the sample-level transmission link, and thus generate distortion.

The non-linearities of the sample-level transmission link can be modelled by an AM/AM and AM/PM curve, where AM and PM refer to the magnitude and phase of a complex signal, respectively. The AM/AM curve reflects the magnitude of the receive signal versus the magnitude of the transmit signal and the AM/PM curve returns the phase rotation of the transmit signal incurred during amplification in the sample-level transmission link versus the magnitude of the transmit signal. The absolute phase of the receive signal at a particular time instance thus equals the phase of the transmit signal at the corresponding time instance plus the phase rotation applied by the channel. These AM/AM and AM/PM curves are often normalized, such that the saturation point (i.e. the maximum) of the AM/AM curve is (1,1). The ordinate and abscissa of such normalized curves are then the inverses of the output backoff ($OBO_{lin}$) and input backoff ($IBO_{lin}$) of the amplifier (e.g. the on-board TWTA for satellite communications or the transmit HPA for non-relayed communications), respectively. Note that in the case of multiple sources, IBO and OBO refer to the global input backoff and global output backoff, respectively. The subscript lin refers to the fact that here these values are shown in linear scale. An example of AM/AM and AM/PM curves is given in FIG. 4. The normalized input amplitudes smaller than 1 are referred to be "before saturation", while the input amplitudes greater than 1 are referred to be beyond or after saturation.

As will be shown, the behaviour of the AM/AM curve after having reached the saturation point (i.e., the (1,1) point) can be very important in the application of certain predistortion techniques. Especially the extent of the drop (also called fall-back) of the AM/AM curve after saturation has a large impact on the performance. When the drop is large, i.e., when the AM output decreases a lot for increasing AM input, the AM/AM curve is said to have a significant "fall-back" after saturation.

The distortion caused by the non-linear part of the channel is best illustrated by considering the symbol-level transmission link. The symbol-level transmission link includes the transmit and receive PSFs and is thus the channel seen between the transmit and receive symbols. The distortion caused by the symbol-level transmission link is illustrated by plotting the location of the received symbols of one source in the absence of channel noise, which is referred to as a scatter plot at the receiver side (in the following, simply called a "scatter plot"). The distortion mainly has two consequences:

(1) in a scatter plot each constellation point becomes a cluster, caused by inter-symbol interference (ISI) due to the memory (caused by the filters, such as IMUX, OMUX, and PSFs) in the channel, and (2) constellation warping occurs, which causes the mass points of the clusters to be no longer on the original system constellation grid.

Such a scatter plot for the third source, for the channel given in FIG. 4, and for four sources of 7.5 Mbaud, 20% roll-off and 32-APSK rate 5/6 from the DVB-S2 standard, is illustrated in FIG. 5.

Techniques to mitigate the distortion effects, caused by the saturated amplifier (e.g. the transmitter HPA or the TWTA in the satellite transponder), by manipulating the transmit symbols or the transmit signal in the transmitter are generally referred to as pre-distortion. Note that an important difference between satellite TWTA predistortion and transmitter HPA predistortion is that the wireless link towards the TWTA should comply with a spectral mask which limits the occupied bandwidth of the predistorted signal. Almost all predistortion techniques in this document apply both for transmitter HPA and satellite TWTA predistortion. It will clearly be indicated below when a certain technique is only applicable to one of both. Especially in a broadcasting context, predistortion can yield significant gains because one predistorter in the transmitter can improve the performance of millions of terminals receiving the signal from the transmitter. The first publications on predistortion date from the 1970s (see amongst others "*Modeling and Performance Evaluation of Nonlinear Satellite Links—A Volterra Series Approach*", Benedetto at al., IEEE Tr. on Aerospace and Electronic Systems, Vol. AES-15, No. 4, pp. 494-507, July 1979 and "*Adaptive Cancellation of Nonlinear Intersymbol Interference for Voiceband Data Transmission*", Biglieri et al., IEEE J. Sel. Areas In Comm., Vol. SAC-2, No. 5, pp. 765-777, September 1984). Early and recent publications focused especially on a Volterra series representation of the non-linear channel with memory. In general, prior art predistortion techniques introduce a circuit in the transmitter that generates "anti-distortion" for the distortion caused by the channel. The combination of the distortion from the channel and the "anti-distortion" generated at the transmitter ideally should minimize the overall distortion at the receiver. The most relevant techniques can be classified in two categories: signal predistortion (also known as fractional predistortion or sample-level predistortion) and symbol predistortion (also known as data predistortion). Symbol predistortion aims at subtracting from the transmitted symbols the interference expected at the receive side. This can for example be done by (statically or dynamically) computing a new constellation from which the transmitted symbols are selected, while maintaining the original system constellation for demapping at the receiver. The new constellation can for example be a non-linear transformation of the original system constellation (in the case of static symbol predistortion). Signal predistortion aims at performing the inverse operation of the sample-level transmission link on the signal provided by the PSF. Ideally, the inverse operation of the sample-level transmission link and the sample-level transmission link itself are applied consecutively on the transmit signal, as illustrated in FIG. 6. In the ideal case the corresponding overall AM/AM and AM/PM curves of the cascade of the predistortion unit and the sample-level transmission link are those of a hard-limiter channel, as shown in FIG. 7.

However, performing the inverse operation of the channel on the signal provided by the PSF is a non-linear operation and causes spectral regrowth, i.e., the occupied frequency bandwidth of the transmit signal becomes larger. Until very recently, signal predistortion was thought not to be applicable for relayed communication such as satellite communications, because the spectral regrowth does not comply with the spectral mask on the transmit signal. For example, it is explicitly mentioned that fractional predistortion cannot be used in satellite communications in U.S. Pat. No. 6,963, 624B1 and in the papers "*Constellation Design for Transmission over Nonlinear Satellite Channels*" (Montorsi et al., IEEE Global Communications Conference (GLOBECOM), pp. 3401-3406, December 2012) and "*Joint precoding and predistortion techniques for satellite telecommunication systems*" (M. Álvarez-Diaz et al., Int'l Symp. on Wireless Communication Systems, September 2005, pp. 688-692). In EP2922217 A1 solutions for the spectral regrowth caused by the inverse operation have been proposed. That is, a low-pass filter is used after the "inverse of the sample-level transmission link" block to filter out the spectral regrowth. The low-pass filter can be a second PSF (which essentially is a low-pass filter), but is not limited to this.

A system level block diagram for two sources with signal predistortion is shown in FIG. 8. For each source, incoming digital data, referred to as a sequence of information bits, is encoded with a forward error correcting code encoder. This encoder can be a single encoder, but can also be the concatenation of several encoders. The encoder output is a stream of coded bits which are mapped to symbols belonging to a certain system constellation, such as PSK, APSK or QAM. This system constellation is agreed upon by transmitter and receiver. The sequence of complex transmit symbols is denoted a. In the case of having more than one source, as in FIG. 8, the sequence of complex symbols is denoted $a_i$ for source i. The system constellation does not need to be the same for each source (e.g., when each source has different throughput requirements). When applying signal predistortion, the transmit symbols are provided to the PSF, the pulse-shaped signals are combined, followed by a signal predistorter yielding a(t), which is sent over the sample-level transmission link. The demodulator locks on one of the sources. Only one demodulator is shown, but of course, multiple demodulators can be present, at the same location or at another location. At the receiver, corresponding to a particular source, the receive signal r(t) is provided to the receive filter (which is typically a PSF) yielding the sequence of receive symbols r, which is demapped, typically using the corresponding system constellation as a reference. The demapper outputs for example likelihood ratios of the coded bits, which are next fed to the decoder. Like the encoder, the decoder can be composed of one or more concatenated decoders. A person skilled in the art of digital receivers will readily understand that one or more decoders can process the received information in an iterative manner and one or more decoders can also exchange information with the demapper in an iterative fashion.

Below symbol predistortion will be elaborated, because in the prior art the performance of signal predistortion is significantly lower than that of the recent symbol predistortion techniques, especially for linearized channels, which become omnipresent because today most of the amplifiers are linear.

FIG. 9 shows an example communication system using symbol predistortion in the presence of two sources. When applying symbol predistortion, the system constellation symbols a are provided to a symbol predistorter, yielding a'. The symbols at the output of the symbol predistorter see the symbol-level transmission link, which includes the PSFs at the transmit and receive side.

High performance symbol predistortion is complex in logic and/or memory, especially for higher order system constellations. In most of the literature it is argued that system constellations larger than 32-APSK cannot be predistorted using symbol predistortion.

For the above-mentioned reasons predistortion was not much applied in satellite communications, despite it being a relatively long studied problem. Only recently, some prior art techniques, e.g. also disclosed in EP1129556 B1, EP1371202 B1, EP1374517 B1, WO2014/122080 A1, U.S. Pat. No. 8,355,462 B2 and US2015/0311927 and in the paper "*Multicarrier Successive Predistortion for Nonlinear Satellite Systems*" (Beidas, IEEE Trans. Comm., April 2015, pp. 1373-1382) significantly changed the paradigm of symbol predistortion and have applied symbol predistortion in a memory-efficient way.

The application of symbol predistortion is now discussed more in detail. First a symbol predistorter for one source is elaborated. A prior art predistortion solution as disclosed in WO2014/122080, is shown in FIG. 10. The proposed techniques apply a successive interference cancellation (SIC) technique where multiple SIC stages predict and correct for the distortion. Iteratively, the distortion error is reduced towards zero. The structure contains several quasi-identical stages, whereby each stage applies a correction on the transmitted symbols. Each stage is called a successive interference cancellation (SIC) stage. Each SIC stage comprises a correction path containing a model of the symbol-level transmission link, which mimics the effect of the full symbol-level transmission link on multiple (for multiple sources) sequences of transmitted digital symbols. The correction term applied in a SIC stage is based on some function of the symbol value at the symbol-level transmission link model output and the corresponding symbol of a predefined constellation. As an example, the predefined constellation can be a simple scaling of the system constellation. For this example, and when referring to a "corresponding" symbol of the predefined constellation, this corresponding symbol is then also a simple scaling of the symbol from the system constellation at the symbol predistorter input. Advantageously said function is the difference between the symbol value at the transmission link model output and the corresponding symbol of the predefined constellation. FIG. 11 shows how the correction term is calculated in this prior art solution. The symbol-level transmission link model is also called forward model in the prior art.

The usage of a symbol predistorter is also possible in case of multiple sources, as proposed in U.S. Pat. No. 8,355,462 B2 and US2015/311927. For such a multiple source system, the block diagrams in FIG. 10 and FIG. 11 needs to be adapted, as can be seen in FIG. 12 and FIG. 13.

However, simulations show that these techniques are still very sensitive to the saturation of the amplifier, and even more sensitive to the fall-back of the AM/AM curve after saturation, which still gives room for improvement.

The sensitivity of predistortion techniques to amplifier saturation can be illustrated through scatter plots. In EP1129556 B1 and EP1371202 B1 it is clear that the outer points in a scatter plot exhibit a tail effect. This is explicitly mentioned in EP1129556 B1: "the corner points, which are at TWT saturation, exhibit a corner tail effect. This is due to the fact that, at these points, the gain of the TWT is zero and perfect convergence is not possible." In EP1374517 B1 it was tried to solve this tail effect, but it is clear from FIG. 10 in that document that the tail effect is still preserved. Note that U.S. Pat. No. 8,355,462 B2 mentions a method denoted "Hard limiter per carrier", which removes all amplitude information from the waveform after the transmit filter. This of course will not work with amplitude modulation, e.g. multiple ring constellations such as 16-APSK and higher (e.g. 32-APSK, . . . , 256-APSK).

In EP1374517 B1 the forward model was modified with respect to the actual symbol-level transmission link in order to improve the convergence of the distortion error towards zero in the multiple SIC stages. More specifically, the adopted AM/AM curve in the model does not fall back anymore beyond saturation. On the contrary, it increases with the bisector beyond the saturation point. FIG. 14 illustrates that the distortion error within the multiple SIC stages converges towards zero, except for some exceptional points, using this technique for the TWTA with characteristics as in FIG. 3. However, the actual distortion error when transmitting the predistorted symbols over the actual symbol-level transmission link is still significant (see FIG. 15), because the transmitted waveform still goes significantly beyond saturation of the actual sample-level transmission link.

Hence, the performance gains of symbol predistortion with multiple SIC stages is poor for channels with significant fall-back after saturation. Consequently, there is a need for an extension of symbol predistortion with multiple SIC stages on channels with fall-back after saturation.

SUMMARY OF THE INVENTION

It is an object of embodiments of the present invention to provide for a solution wherein symbol predistortion can be applied on non-linear channels.

In a first aspect the invention relates to a transmitter device arranged for receiving at least one source signal comprising a source bit stream and for generating a signal for transmission. The transmitter device comprises
- mapping means for mapping, for each source signal, a version of the source bit stream to a sequence of digital symbols selected from a system constellation,
- a first predistortion circuit arranged for generating a predistorted version of the sequence of digital symbols of each source signal,
- modulation means arranged for receiving the predistorted version of the sequence of digital symbols of each source signal and for outputting an aggregate pulse-shaped signal,
- a second predistortion circuit for generating a predistorted version of the aggregate pulse-shaped signal, wherein said first predistortion circuit comprises at least one correction stage provided with a correction path for determining, for each source signal, a correction term being a function of the output of a model, said model comprising
- a circuit to emulate the modulation means and said second predistortion circuit,
- a circuit to emulate a non-linear transmission link over which the predistorted version of the aggregate pulse-shaped signal is to be transmitted for amplitude levels before saturation of an AM/AM characteristic of the transmission link occurs and to emulate the non-linear transmission link for amplitude levels beyond saturation of said AM/AM characteristic, and
- a circuit to emulate demodulation means at a receiver side, said correction term for each source signal further being function of a corresponding symbol of a predefined constellation for each source signal,
said first predistortion circuit further arranged for adding, for each source signal, said correction term to a digital symbol of said sequence applied to said first distortion circuit or to a predistorted version of the digital signal output by a preceding correction stage of said first predistortion circuit and for outputting the result of said adding as an update of said predistorted version of said digital symbol.

By taking into account the second predistortion circuit in the model used for determining the correction term the above-mentioned problem can indeed be solved. One of the circuit in the model is capable of emulating the non-linear transmission link not only for amplitude levels before saturation of an AM/AM characteristic but also for amplitude levels beyond saturation of the AM/AM characteristic. As illustrated further in this document, simulations indicate that this approach indeed yields an important gain.

In one embodiment the second predistortion circuit is arranged for performing clipping on the aggregate pulse-shaped signal.

In a further embodiment the second predistortion circuit is also arranged for performing low-pass filtering. This makes the transmitter device suitable for use in scenarios with relayed links.

In one embodiment the modulation means comprises a pulse shaping filter.

In an advantageous embodiment the predefined constellation is a scaling of the system constellation.

In a preferred embodiment the circuit to emulate the non-linear transmission link for amplitude levels beyond saturation of the AM/AM characteristic, is arranged for using a non-decreasing function for the AM/AM characteristic beyond saturation.

Advantageously, the non-decreasing function is a flat curve.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
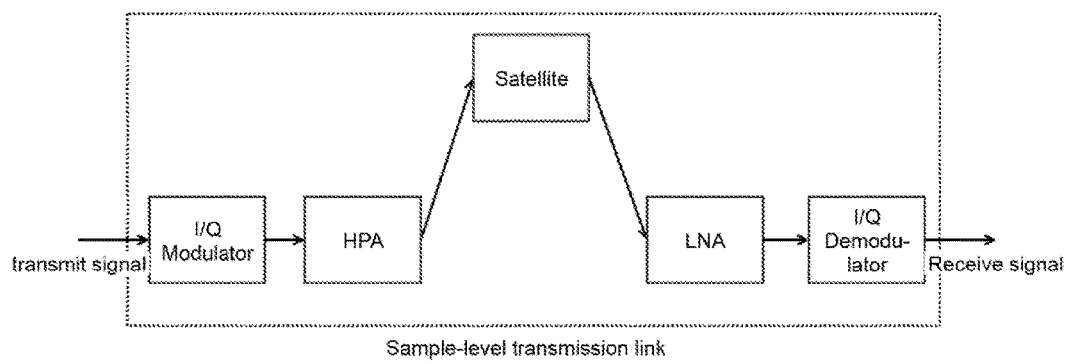
FIG. 1 illustrates a typical satellite communication link.
Figure 2:
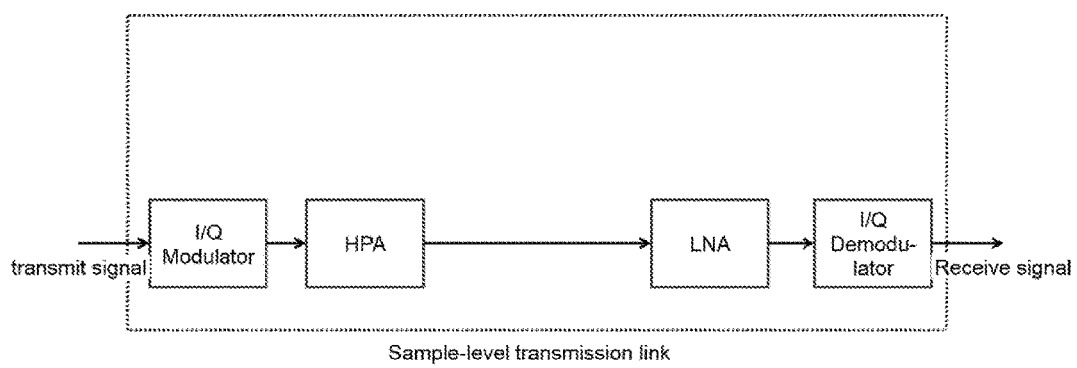
FIG. 2 illustrates a sample-level transmission link for a non-relayed communication system.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 16:
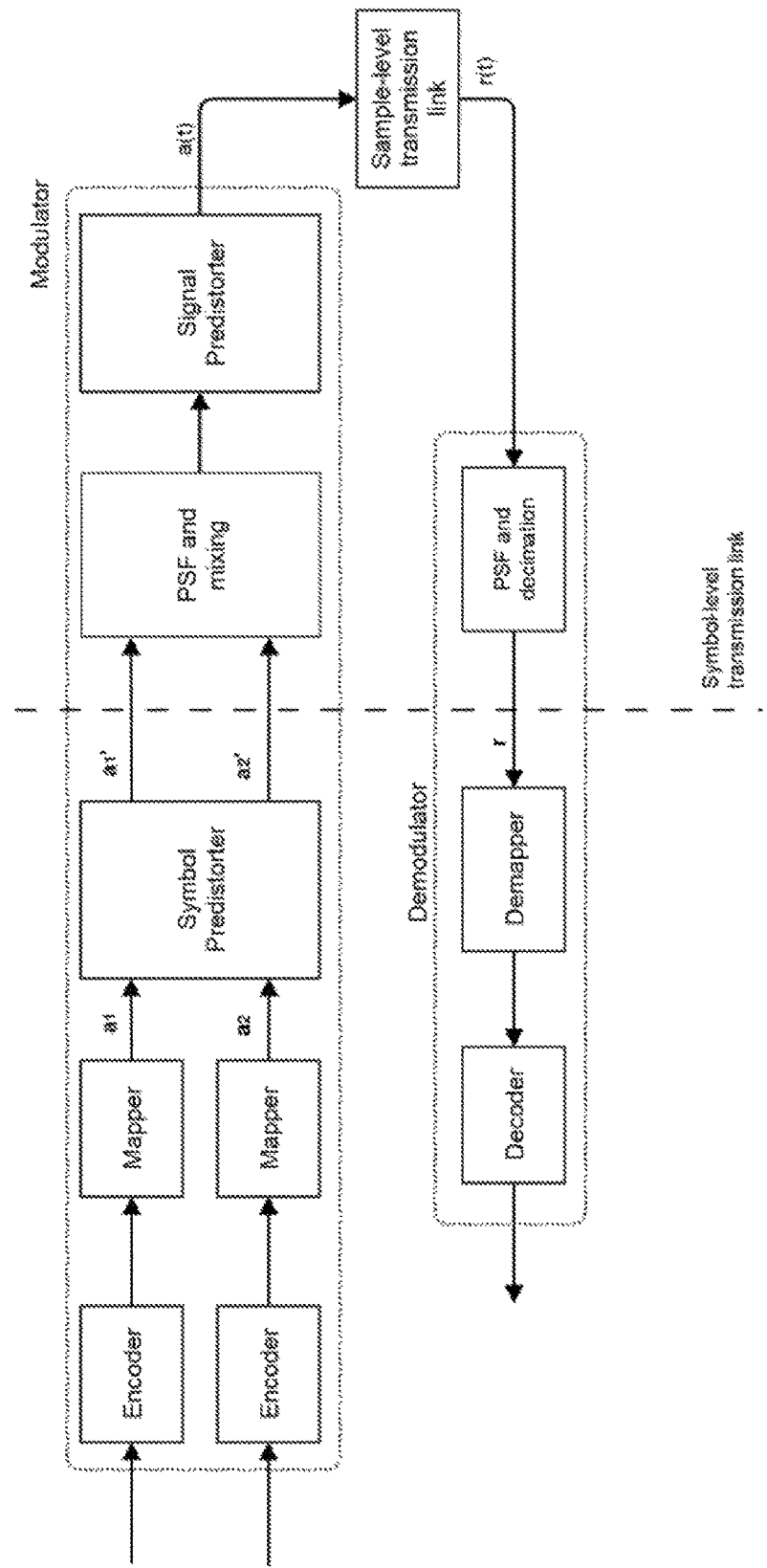
FIG. 16 illustrates a system level overview of the transmitter and receiver according to the invention.

In a first aspect the invention discloses a transmitter device. FIG. 16 illustrates a scheme with two signal sources wherein the transmitter is applied. Each source bit stream is encoded and the coded version of the source stream of bits is mapped to symbols of a system constellation as set out previously. The resulting sequence of digital symbols is applied to the symbol predistorter block.

Figure 10:
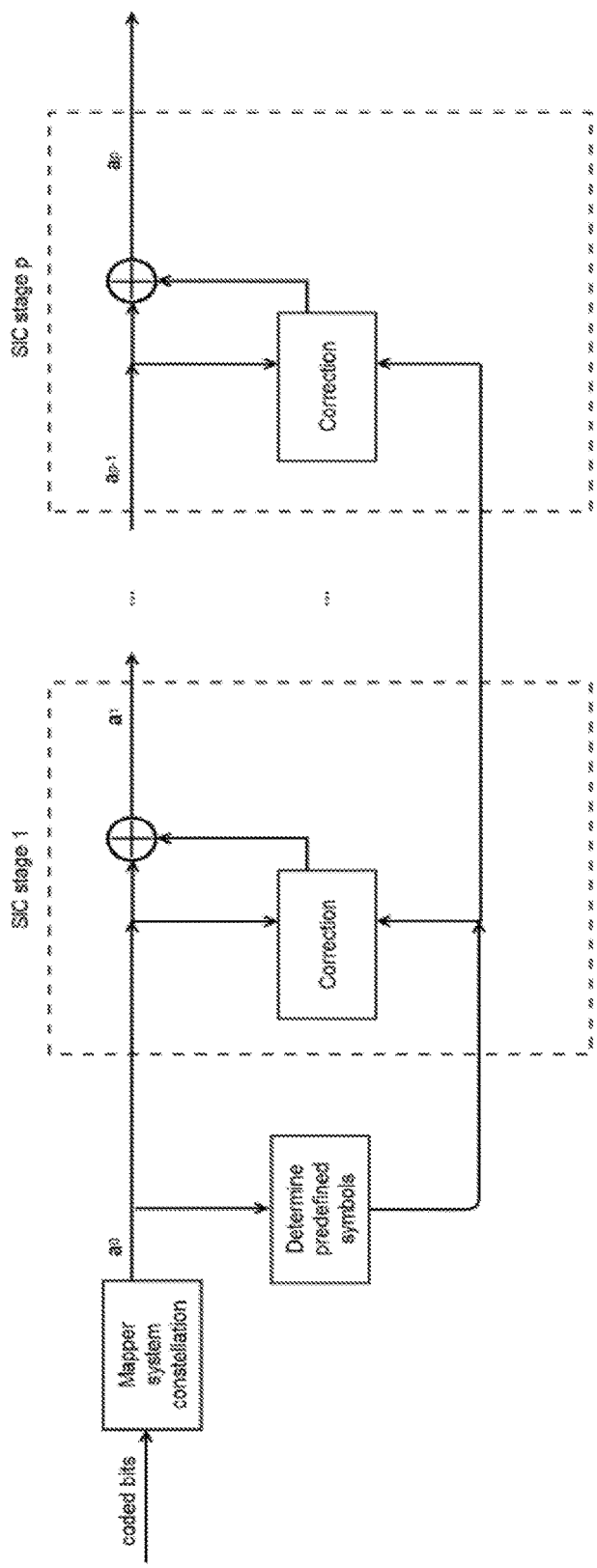
FIG. 10 illustrates a prior art symbol predistortion solution.

The invention improves the performance of the best known symbol predistorters, which are disclosed in EP1129556 B1, EP1371202 B1, EP1374517 B1, WO2014/122080 A1, U.S. Pat. No. 8,355,462 B2 and US2015/0311927 and in the paper "Multicarrier Successive Predistortion for Nonlinear Satellite Systems" (Beidas, IEEE Trans. Comm., April 2015, pp. 1373-1382). The techniques proposed in the prior art are summarized here, as they form the starting point to elucidate the invention. A prior art predistortion solution is shown in FIG. 10. The structure contains several SIC stages, whereby each stage applies a correction on its input symbols, based on the difference between a symbol from a constellation and the output of a symbol-level transmission link model. That is, within each SIC stage n, the input symbols are updated as follows $$symbol_{n+1} = symbol_n + (symbol\ correction_n)$$

The correction term for SIC stage n can be written as $$symbol\ correction_n = f_A{}^n((predefined\ constellation\ symbol), (model\ output_n))$$

where $f_A{}^n$ is a function dependent on the iteration number n. Recall that the symbol-level transmission link model is also called forward model in the prior art. In the equation above, it is referred to as "model". In a low-complexity implementation of this function, the correction term can be written as $$symbol\ correction_n = ((predefined\ constellation\ symbol) - (model\ output_n)) * A_n$$

Figure 11:
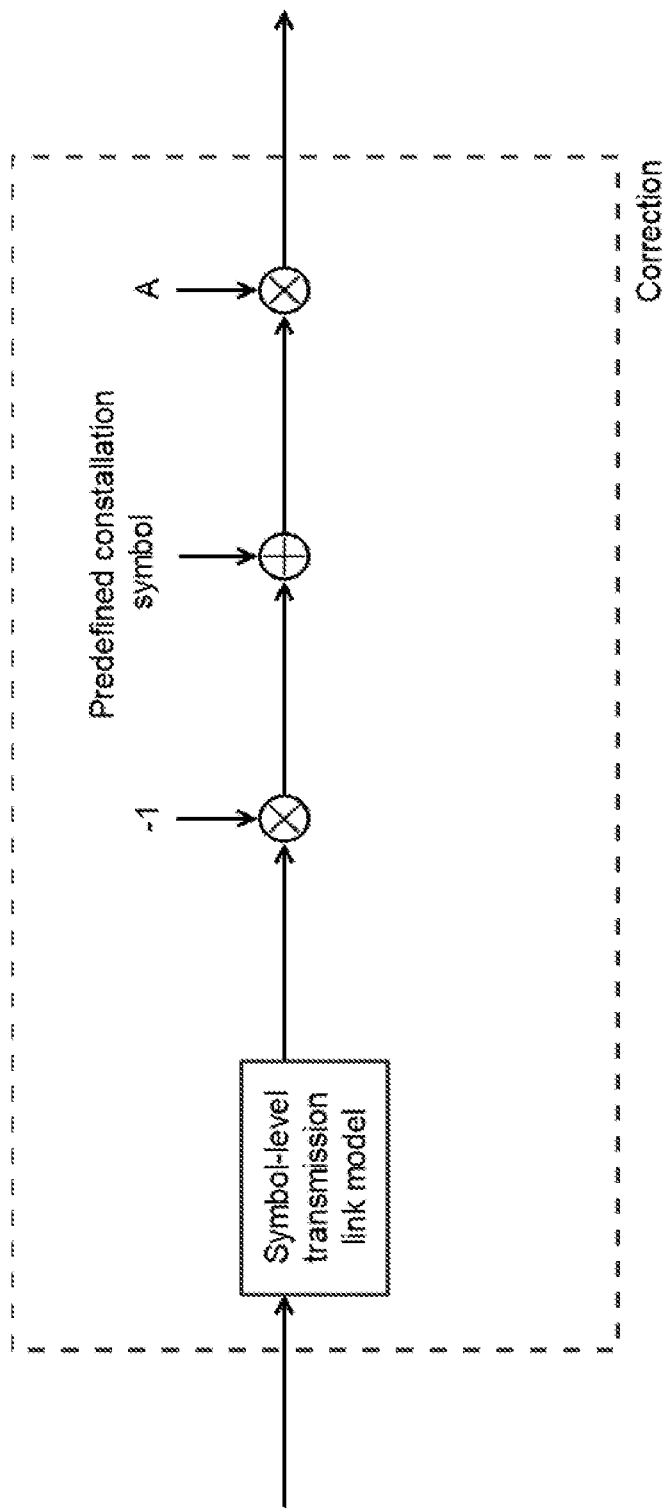
FIG. 11 illustrates a block diagram of the correction phase in the SIC-based symbol predistorter for one source.
Figure 12:
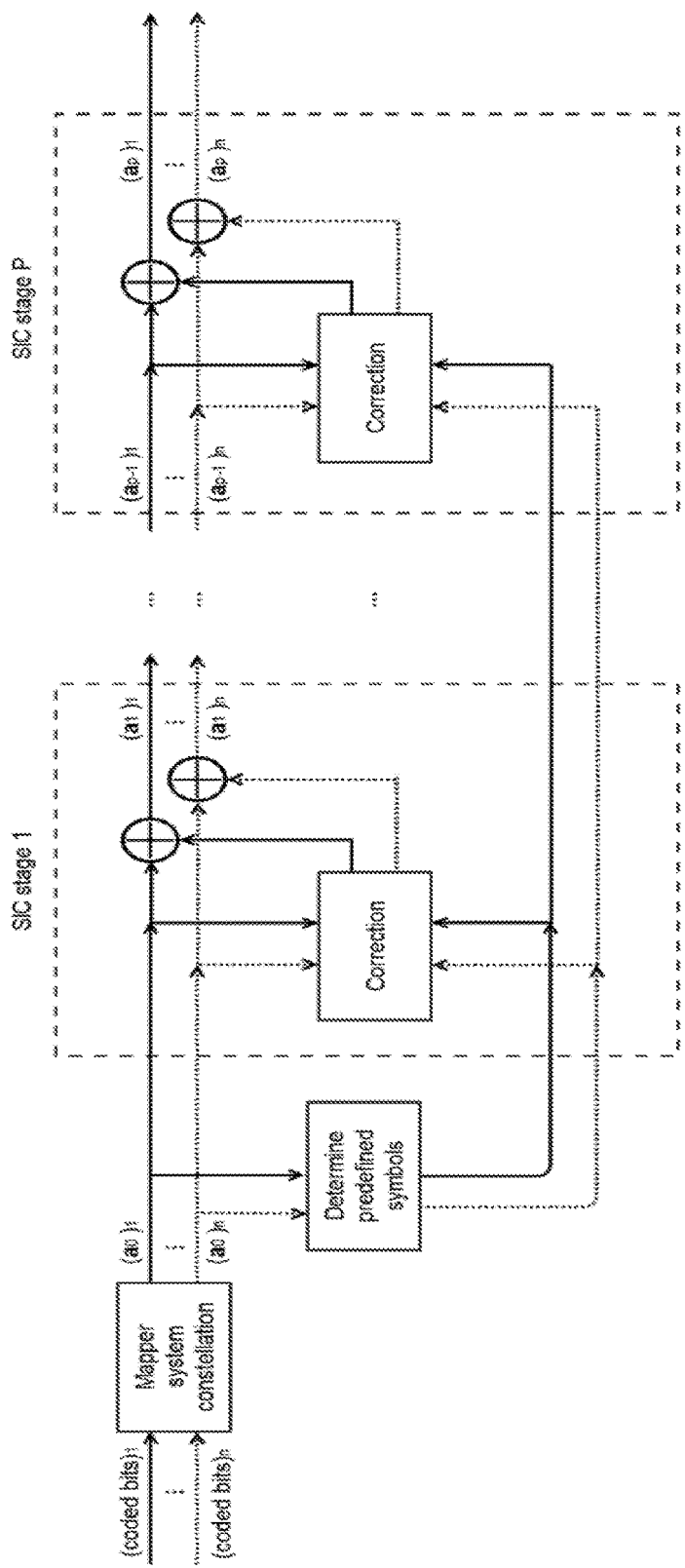
FIG. 12 illustrates the adaptation of FIG. 10 for multiple sources.
Figure 13:
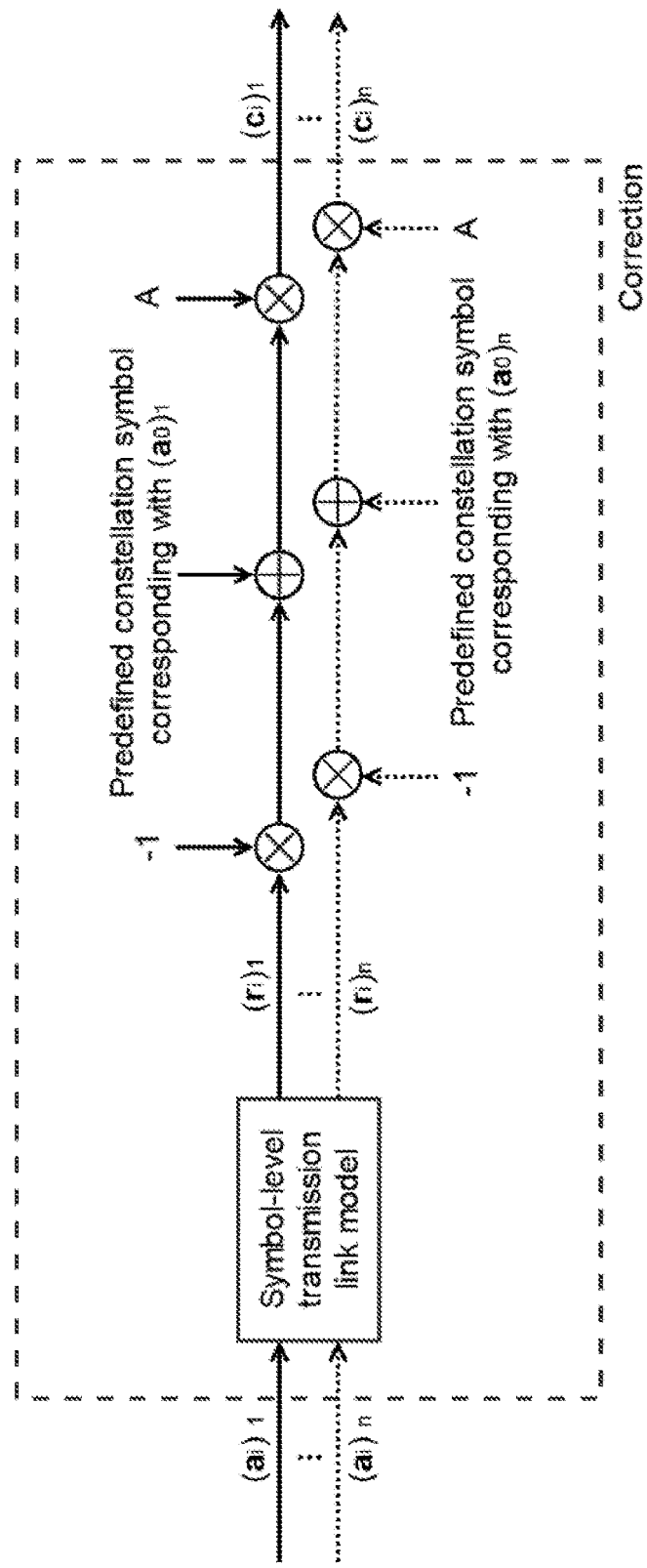
FIG. 13 illustrates the adaptation of FIG. 11 for multiple sources.

Note that a SIC stage is indexed with n. The variable $A_n$ is a scaling factor that can be tuned to optimize the convergence speed. In a further simplified form $A_n$ is constant and equal to A for all stages. This is illustrated in FIG. 11. The predefined constellation symbol is chosen from a predefined constellation corresponding to the transmit symbol. The predefined constellation takes into account the modulated output backoff of the symbol-level transmission link model. In the prior art ways to determine such a predefined constellation are disclosed, see e.g. in WO2014/122080 A1. For example, one can use the SIC stages to target a particular modulated output backoff, i.e., to target a particular mean of the square of the received symbols. This can be done by defining the predefined constellation as a scaling of the system constellation (e.g. the 32APSK constellation from the DVB-S2 standard). Alternatively, the predefined constellation grid can be determined as the collection of the means of each of the clusters in a scatter plot at the receiver side. WO2014/122080 A1 provides more detailed explanations. As mentioned above, the extension to multiple sources is made in U.S. Pat. No. 8,355,462 B2 and US2015/311927, and illustrated in FIG. 12 and FIG. 13.

An initial approximation as mentioned in EP1129556 B1 and EP1371202 B1 can be made on the transmit symbols before the multiple SIC stage to speed up the convergence of the distortion error towards zero. In EP1129556 B1 and EP1371202 B1, it is mentioned that thanks to the initial approximation it is sufficient to do three SIC iterations instead of six SIC iterations. So it yields a complexity reduction (less iterations) for the same performance. This initial approximation can advantageously be applied to the technique proposed in this invention to yield the same complexity reduction.

Figure 17A:
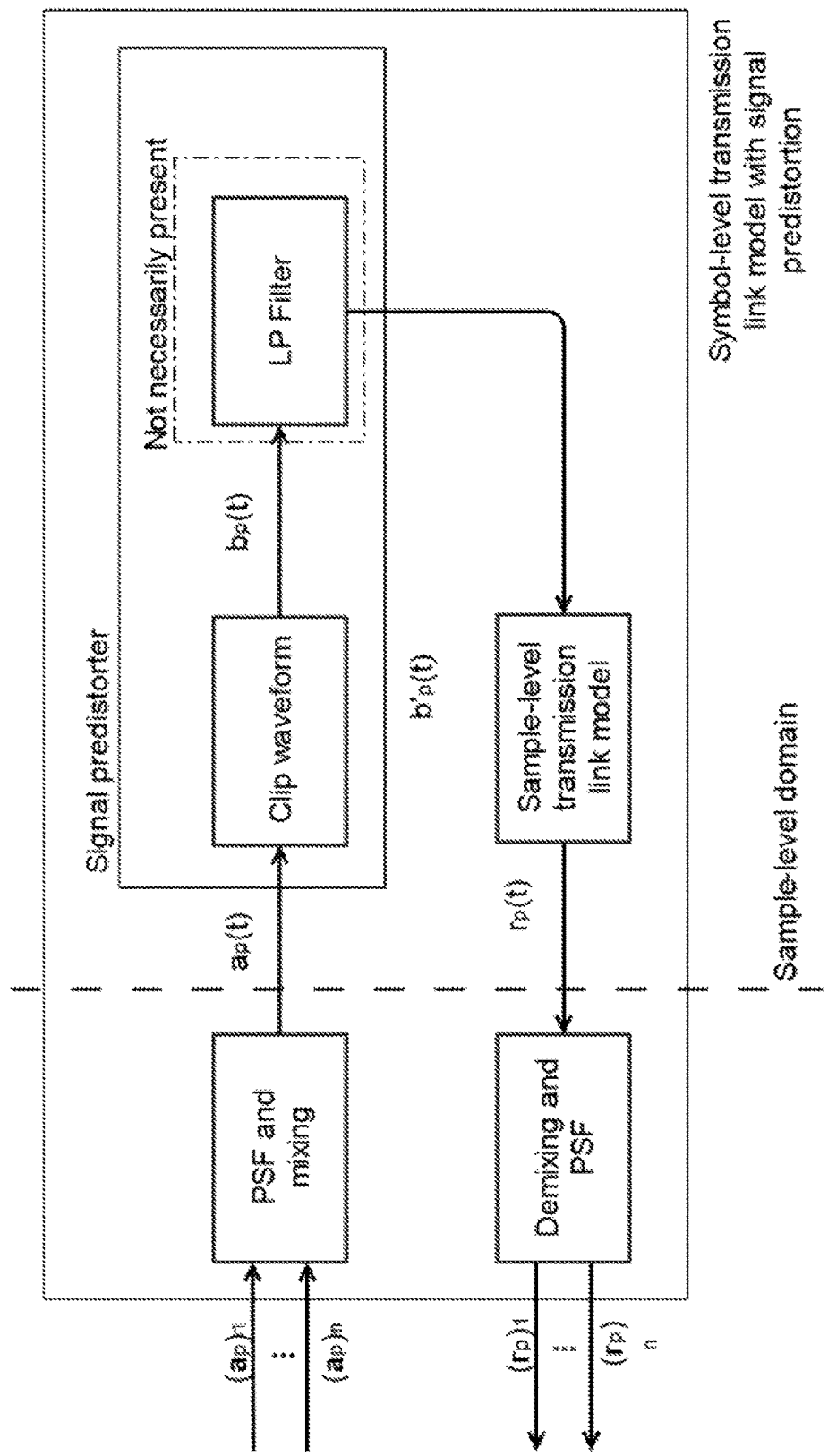
FIGS. 17a and 17b illustrate the symbol-level transmission link model or the forward model of the present invention in the case of a multiple source scenario.
Figure 17B:
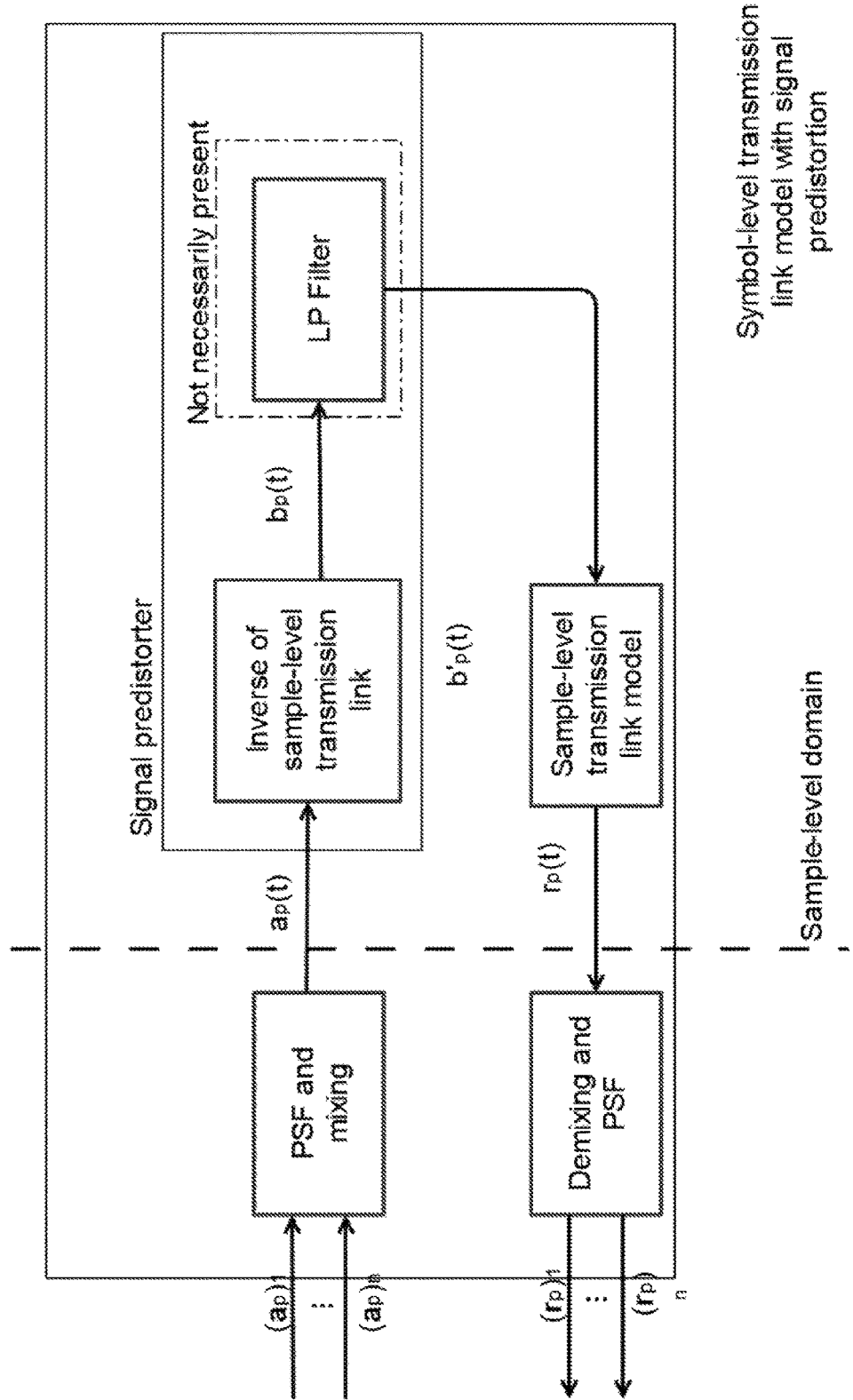

FIGS. 17a and 17b show how to compute the symbol-level transmission link model output in the case of multiple sources according to the invention. This symbol-level transmission link model output is above referred to as model output$_n$ in the case of one source. First, the symbols are mapped on a waveform through the PSF and mixing. One has now entered the "sample-level domain".

According to the invention, a signal predistorter is applied, both in the symbol-level transmission link model used by the symbol predistorter as well as after the PSF applied after the symbol predistorter. The main effect of the signal predistorter is that the peak-to-average power ratio (PAPR) is significantly reduced. FIG. 17a and FIG. 17b illustrate the addition of a signal distorter in the transmission link model. For example, the waveform is clipped in the signal predistorter. For relayed communication, a clipped waveform, together with its spectral regrowth, cannot be transmitted over the air, so that a low-pass filter is included. In general, the clipping of the waveform (FIG. 17a) is just an example. Any sample-level manipulation of the signal is possible in the signal predistorter. For example, a non-linear transformation applying the inverse of the sample-level transmission link can be applied (FIG. 17b). Clipping the waveform is just one of these possible manipulations. After the signal predistorter, the sample-level transmission link model is applied, followed by the demixing, PSF and decimation at the receiver. By applying the latter (i.e., the PSF and decimation), the sample-domain is left again to come back in the symbol domain. Note that in the prior art, the signal predistorter was not present. Consequently, the PAPR was much higher.

Figure 14:
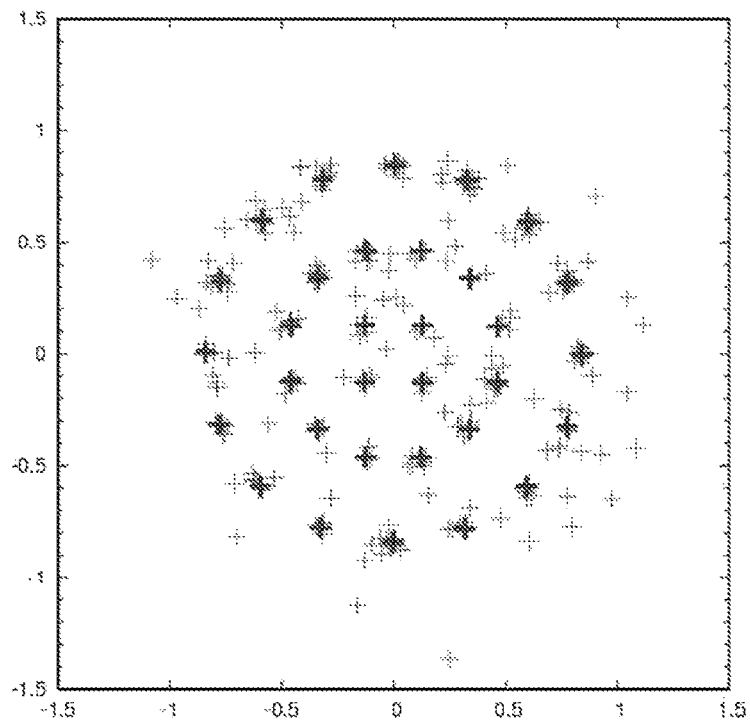
FIG. 14 illustrates a scatter plot of the received constellation at the last SIC stage of the symbol predistorter using EP1374517 B1.

The sample-level transmission link model can be as simple as a block applying the AM/AM and AM/PM characteristics of the on-board TWTA. As mentioned in the prior art, it can also contain other elements of the transponder, such as IMUX and OMUX filters. Clearly, by looking at the symbol correction formula, a decrease of the amplitude by the model (e.g. due to operation beyond saturation level of the AM/AM curve) will be followed by an increase of the amplitude of the transmitted symbol. This will generally lead to even higher amplitudes at the input of block emulating the AM/AM characteristic, which leads to a further decrease of the amplitude at the output of the sample-level and symbol-level transmission link models. This sensitivity of predistortion techniques to amplifier saturation and fallback was already observed before (e.g. in EP1129556 B1 and EP1371202 B1), as explained in the introduction above. This sensitivity was also referred to as a tail effect, as in a scatter plot, "tail-like shapes" were visible around symbols with the highest amplitudes. In EP1374517 B1, a solution for this "tail effect" was tackled by modifying the sample-level transmission link model. More specifically, the AM/AM curve was changed so that it increases with the bisector beyond the saturation point. The results of applying this technique are shown in FIG. 14.

As an example illustrating the need for the invention, performance evaluations have been carried out. A constellation and low-density parity-check (LDPC) code of the DVB-S2 standard is used to encode the data bits followed by the symbol mapping and modulation. A state-of-the-art receiver including a demapper and decoder is used to evaluate the frame error rate (FER) performance of the predistorted system.

Figure 3:
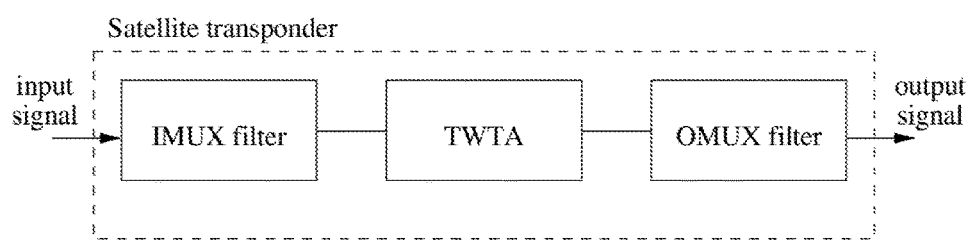
FIG. 3 illustrates a simplified scheme of a satellite transponder.
Figure 4:
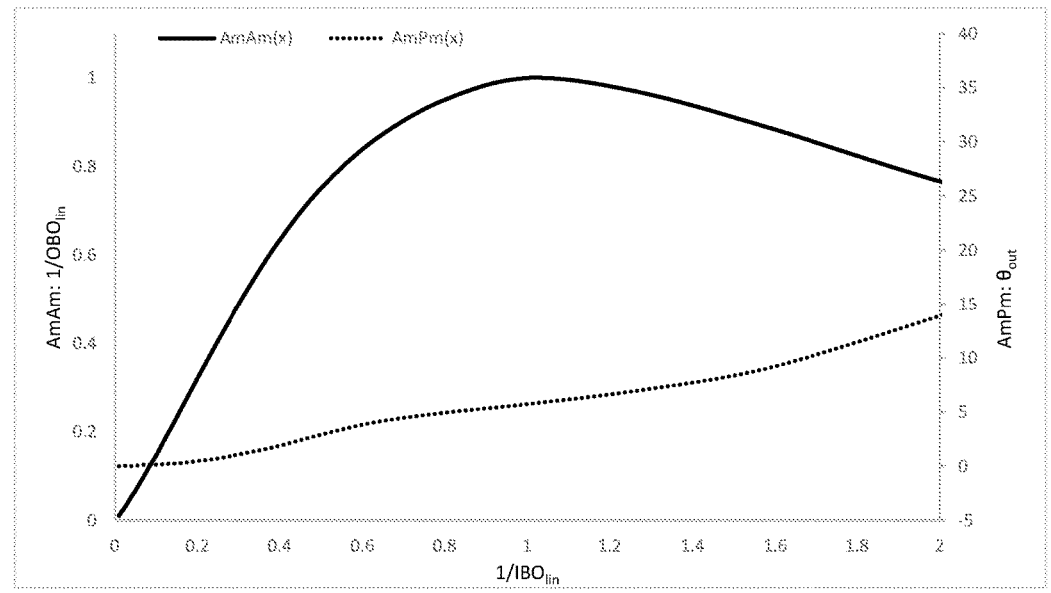
FIG. 4 illustrates the AM/AM and AM/PM curves of an amplifier.
Figure 5:
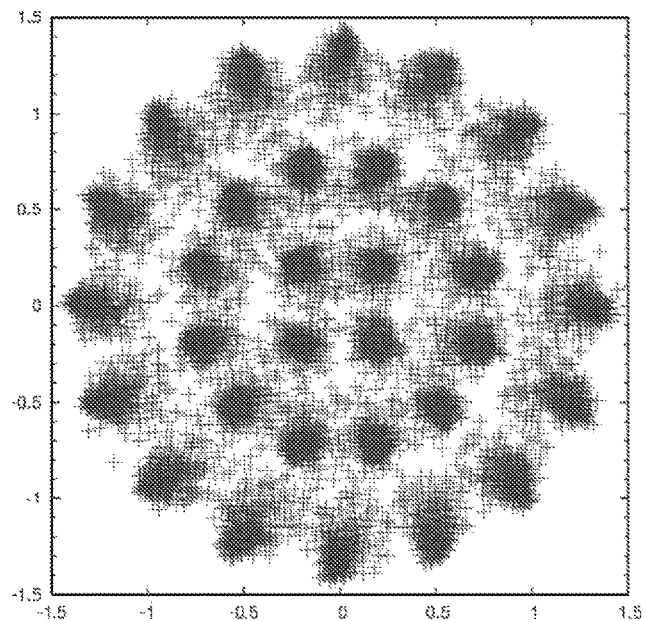
FIG. 5 illustrates a scatter plot for a symbol-level transmission link including an amplifier with characteristics shown in FIG. 4, whereby noise is discarded.
Figure 6:
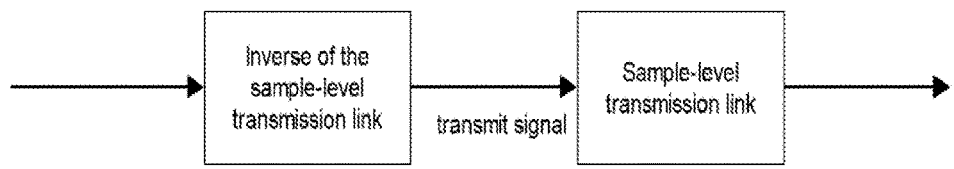
FIG. 6 illustrates an ideal implementation of a signal predistortion circuit. However, in satellite communications, such implementation cannot be used, because the bandwidth of the link between the predistortion circuit and the transponder is limited.
Figure 7:
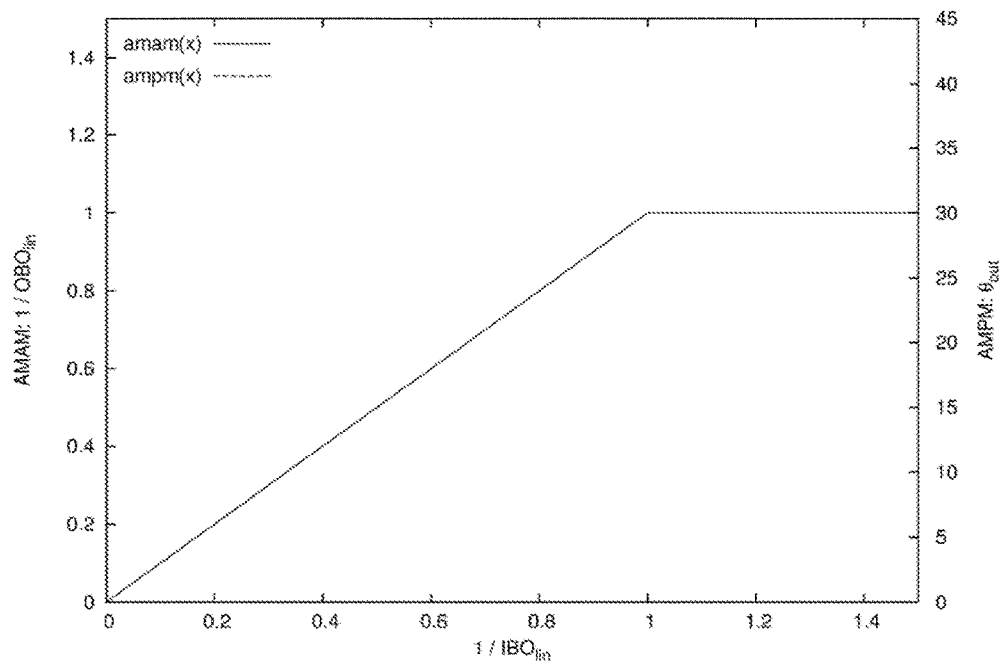
FIG. 7 illustrates AM/AM and AM/PM characteristics of a hard-limiter channel. The AM/PM curve coincides with the x-axis.
Figure 8:
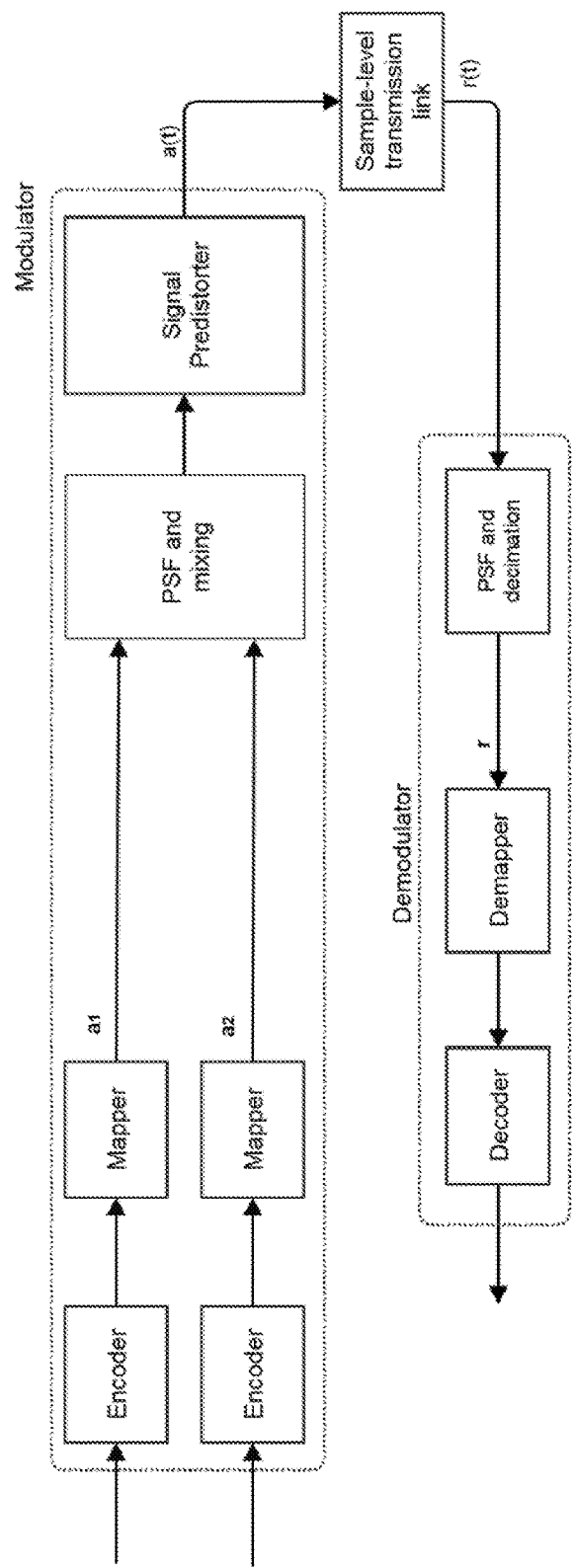
FIG. 8 illustrates a multiple source communication system with a signal predistorter.
Figure 9:
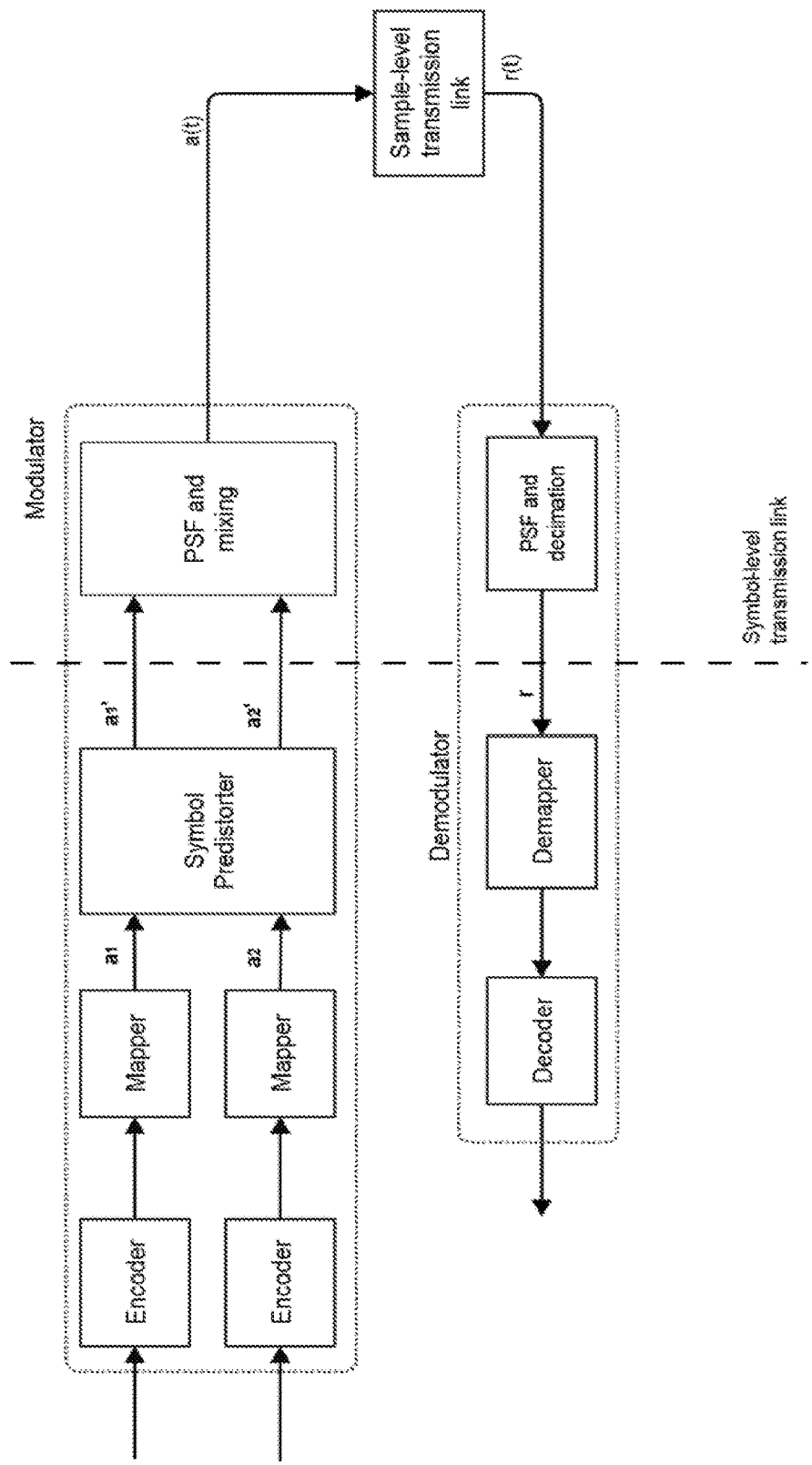
FIG. 9 illustrates a multiple source communication system with a symbol predistorter.

The comparison between prior art techniques and the invention is performed for the 32APSK constellation with FEC rate 5/6 as defined in the DVB-S2 standard. The performance was evaluated on the non-linear channel displayed in FIG. 3. Relayed communication is assumed, i.e., the power amplifier characterized by FIG. 4 is present in a satellite transponder. The simulations are performed in a scenario with multiple sources (multicarrier), more specifically for four sources or carriers of 7.5 MBaud and a roll-off of 20%. The carrier spacing is (7.5*1.2) MHz. The performance of the third carrier starting from the lowest frequency carrier is shown.

Figure 15:
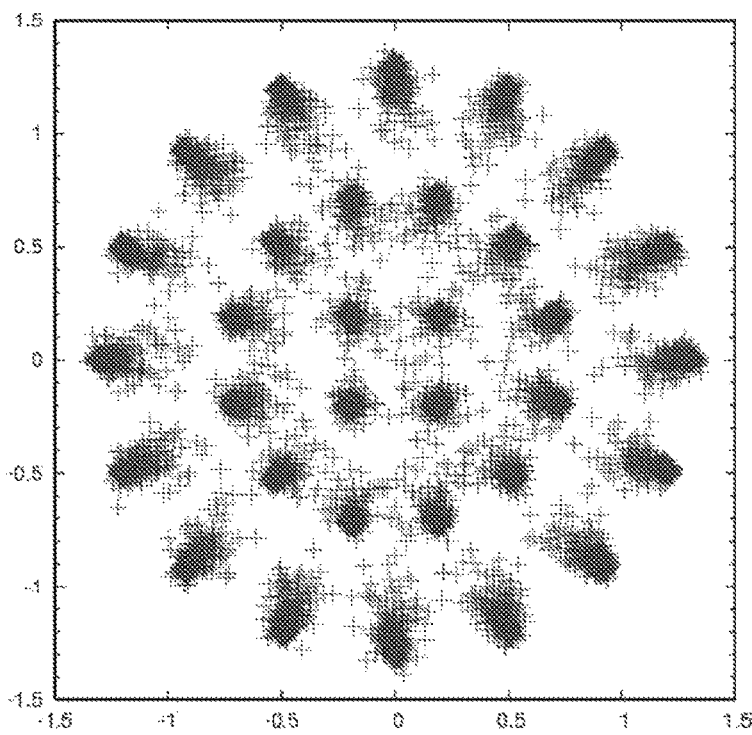
FIG. 15 illustrates a scatter plot of the received constellation at the receiver in the actual transmission using EP1374517 B1.

For this specific transmission scenario the already mentioned technique disclosed in EP1374517 B1 achieves a peak-to-average power ratio (PAPR) of the transmit signal of only 14.5 dB for an optimal global input backoff (IBO) of 4.5 dB. It illustrates that a modification of the forward model still does not prevent the waveform from going significantly beyond saturation (more specifically, 10 dB beyond saturation). This adversely affects the performance as the AM/AM response of the actual amplifier falls back beyond saturation in contrast to the SIC stages where the modified forward model (increasing after saturation on the bisector) was used. This explains the significant differences between the two scatter plots shown in FIG. 14 and FIG. 15.

The model used to determine the correction term comprises apart from a circuit that emulates the modulator and the signal predistorter, and a circuit that emulates the non-linear transmitter link also a circuit that mimics the demodulator in a receiver device. It is to be noted that any receiver comprises a demodulator.

Besides adding the signal predistortion circuit, it is beneficial to modify the forward model. Just like in EP1374517 B1, the AM/AM curve of the sample-level transmission link model does not decrease after saturation. However, we found that keeping the AM/AM curve flat after saturation yields the best results. Any non-decreasing function beyond the saturation level is applicable in the forward model. FIG. 16 provides an overview figure showing that signal predistortion, besides being used in the SIC stages, is also used outside of the symbol predistorter.

Simulating the predistortion technique according to the invention, it is computed that the PAPR of the transmit signal equals 8.33 dB. Thus, the predistortion technique according to the invention significantly decreases the PAPR with respect to the prior art. Furthermore, the simulation results show that the additional distortion caused by the clipping and filtering the waveform can be compensated by the corrections made in the SIC stages. By making sure that the AM/AM curve of the sample-level transmission link model does not decrease after saturation, the error on the received symbols in the iterative process does not increase.

Figure 18:
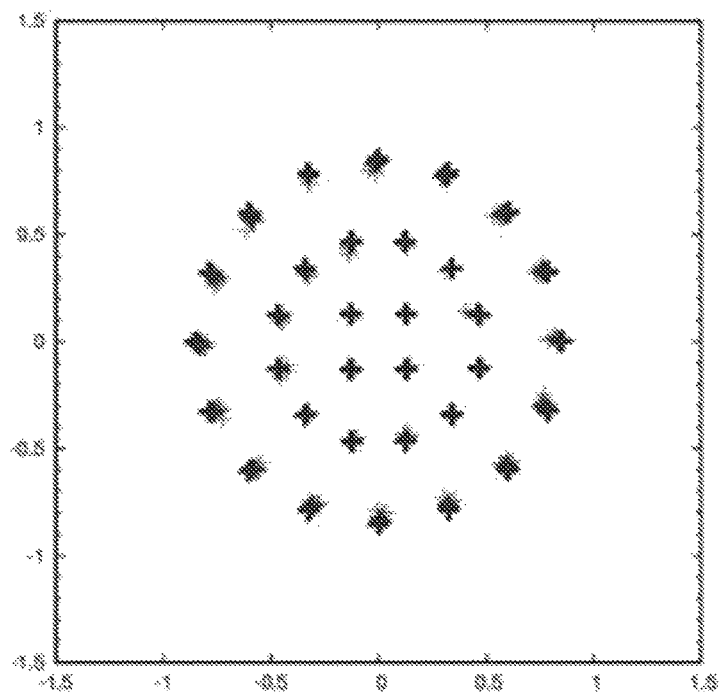
FIG. 18 illustrates a scatter plot of the received constellation at the last SIC stage of the symbol predistorter according to the invention.
Figure 19:
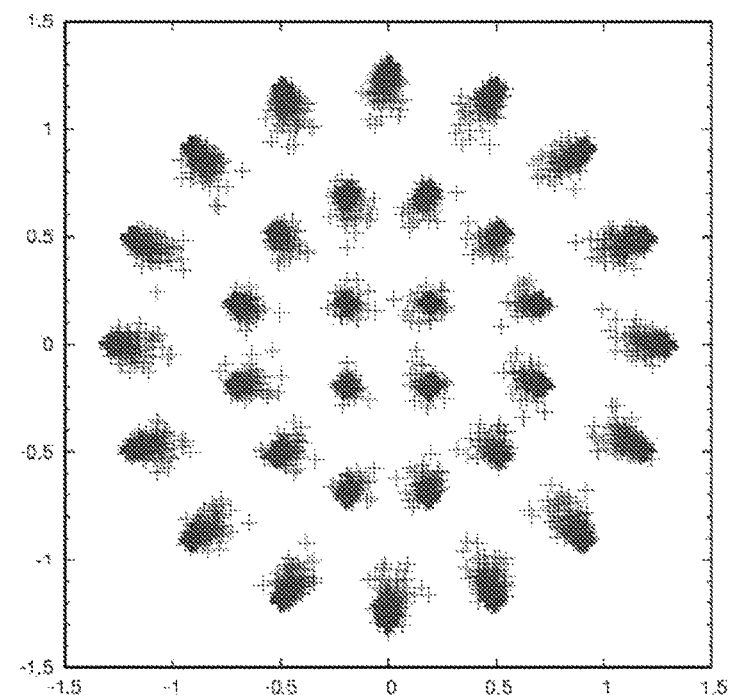
FIG. 19 illustrates a scatter plot of the received constellation at the receiver in the actual transmission according to the invention.

FIG. 18 and FIG. 19 illustrate that the predistortion technique according to the invention reduces not only the distortion within the multiple SIC stages (FIG. 18), but also in the actual distortion error when transmitting over the channel (FIG. 19).

Subjects of the comparison are the symbol predistorter, with (EP1374517 B1) and without (U.S. Pat. No. 7,123,663) modifying the forward model, and the predistortion technique according to the invention.

The metric by which the results are compared, is the required saturated transponder power density versus the receiver noise density, denoted CsatN0, for a Frame Error Rate (FER) equal to 0.1. For reference, the modulation error rate (MER) is also provided.

Without predistortion and with an optimal IBO=4.5 dB, the simulation results show that the threshold is CsatN0=19.47 dB at FER=0.1 (MER=18.82/19.97 dB for sources 3/4, respectively). Due to the fall-back of the AM/AM characteristic of the TWTA, the symbol predistorter without modification of the forward model does not converge regardless of the number of SIC stages (i.e., its performance is worse than without predistortion as too much backoff must be given in order to avoid divergence of the error on the received symbols, which occurs when the waveform goes beyond saturation). The simulation with a symbol predistorter with modification of the forward model as described in EP1374517 B1 is performed at its optimal IBO=4.59 dB, and with an optimized predefined constellation (being a scaling of the system constellation with −3.4 dB for sources 1 and 2, and −3.6 dB for sources 0 and 3) and optimum correction scaling A of 0.5, and has a CsatN0=18.94 dB at FER=0.1 (MER=21.37/22.45 dB for sources 3/4, respectively) for six stages, thus a gain of 0.53 dB. The simulation with the symbol predistorter according to the invention, also with six SIC stages, the same predefined constellations as above (scaled with −3.4 dB and −3.6 dB) and an optimum correction scaling A of 0.6, is performed at its optimal IBO=4.5 dB, and has a CsatN0=18.04 dB at FER=0.1 (MER=25.02/26.94 dB for sources 3/4, respectively), thus an additional gain of 0.9 dB over the prior art techniques, which is significant. Similar gains are observed with three SIC stages. The improved MER is also clearly visible from the scatter plots. Note that only sources 3 and 4 have been discussed due to the symmetry in the system giving similar results for sources 1 and 2.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A transmitter device arranged for receiving at least one source signal comprising a source bit stream and for generating a signal for transmission, said transmitter device comprising:
   mapping means for mapping, for each source signal, a version of said source bit stream to a sequence of digital symbols selected from a system constellation,
   a first predistortion circuit arranged for generating a predistorted version of said sequence of digital symbols of each source signal,
   modulation means arranged for receiving said predistorted version of the sequence of digital symbols of each source signal and for outputting an aggregate pulse-shaped signal,
   a second predistortion circuit for generating a predistorted version of said aggregate pulse-shaped signal,
   wherein said first predistortion circuit comprises at least one correction stage provided with a correction path for determining, for each source signal, a correction term being a function of the output of a model, said model comprising
   a circuit to emulate said modulation means and said second predistortion circuit,
   a circuit to emulate a non-linear transmission link over which said predistorted version of said aggregate pulse-shaped signal is to be transmitted for amplitude levels before saturation of an AM/AM characteristic of said transmission link occurs and to emulate said non-linear transmission link for amplitude levels beyond saturation of said AM/AM characteristic, and
   a circuit to emulate demodulation means at a receiver side,
   said correction term for each source signal further being function of a corresponding symbol of a predefined constellation for each source signal,
   said first predistortion circuit further arranged for adding, for each source signal, said correction term to a digital symbol of said sequence applied to said first distortion circuit or to a predistorted version of said digital symbol output by a preceding correction stage of said first predistortion circuit and for outputting the result of said adding as an update of said predistorted version of said digital symbol.

2. The transmitter device of claim 1, wherein said second predistortion circuit is arranged for performing clipping on said aggregate pulse-shaped signal.

3. The transmitter device of claim 1, wherein said second predistortion circuit is arranged for performing low-pass filtering.

4. The transmitter device of claim 1, wherein said modulation means comprises a pulse shaping filter.

5. The transmitter device of claim 1, wherein said predefined constellation is a scaling of said system constellation.

6. The transmitter device of claim 1, wherein said circuit to emulate said non-linear transmission link for amplitude levels beyond saturation of said AM/AM characteristic, is arranged for using a non-decreasing function for said AM/AM characteristic beyond saturation.

7. The transmitter device of claim 6, wherein said non-decreasing function is a flat curve.

* * * * *